(12) United States Patent
Heo et al.

(10) Patent No.: US 7,976,737 B2
(45) Date of Patent: *Jul. 12, 2011

(54) SILVER ORGANO-SOL INK FOR FORMING ELECTRONICALLY CONDUCTIVE PATTERNS

(75) Inventors: Soon Yeong Heo, Daegu (KR); Dong Sung Seo, Daejun (KR); Eun Ji Lee, Daeju (KR); Hyun Myung Jang, Kyungsangbuk-do (KR)

(73) Assignee: Exax Inc., Gumi-Si (KR)

( * ) Notice: Subject to any disclaimer, the term of this patent is extended or adjusted under 35 U.S.C. 154(b) by 85 days.

This patent is subject to a terminal disclaimer.

(21) Appl. No.: 12/065,662

(22) PCT Filed: Dec. 2, 2005

(86) PCT No.: PCT/KR2005/004099
§ 371 (c)(1),
(2), (4) Date: Jul. 25, 2008

(87) PCT Pub. No.: WO2007/029902
PCT Pub. Date: Mar. 15, 2007

(65) Prior Publication Data
US 2011/0005428 A1    Jan. 13, 2011

(30) Foreign Application Priority Data

Sep. 7, 2005  (KR) .................. 10-2005-0083226
Oct. 11, 2005 (KR) .................. 10-2005-0095625

(51) Int. Cl.
*H01B 1/22* (2006.01)
*H01B 1/02* (2006.01)
*H01B 1/12* (2006.01)
*B05D 5/12* (2006.01)

(52) U.S. Cl. ............. 252/519.21; 252/519.2; 252/520.3; 427/466; 427/125; 427/469; 347/100

(58) Field of Classification Search ............. 252/519.21, 252/519.2, 520.3; 427/466, 125, 469; 347/100
See application file for complete search history.

(56) References Cited

U.S. PATENT DOCUMENTS

| | | | |
|---|---|---|---|
| 5,568,173 A * | 10/1996 | Leenders et al. | 347/96 |
| 5,621,448 A * | 4/1997 | Oelbrandt et al. | 347/96 |
| 5,621,449 A * | 4/1997 | Leenders et al. | 347/101 |
| 5,665,498 A * | 9/1997 | Savage et al. | 430/41 |
| 5,751,325 A * | 5/1998 | Leenders et al. | 347/96 |
| 6,419,987 B1 * | 7/2002 | Bauer et al. | 427/302 |
| 2003/0148024 A1 * | 8/2003 | Kodas et al. | 427/125 |
| 2006/0043346 A1 * | 3/2006 | Kodas et al. | 252/514 |
| 2006/0073667 A1 * | 4/2006 | Li et al. | 438/311 |
| 2008/0145560 A1 * | 6/2008 | Khaselev et al. | 427/466 |
| 2009/0090273 A1 * | 4/2009 | Heo et al. | 106/31.92 |
| 2010/0123102 A1 * | 5/2010 | Heo et al. | 252/519.2 |
| 2010/0193751 A1 * | 8/2010 | Heo et al. | 252/514 |

FOREIGN PATENT DOCUMENTS

| | | | |
|---|---|---|---|
| GB | 1439478 | * | 6/1976 |
| JP | 63-278983 A | | 11/1988 |
| JP | 1988278983 | | 11/1988 |
| JP | 5-311103 A | | 11/1993 |
| JP | 199311103 | | 11/1993 |
| JP | 11-188965 A | | 7/1999 |
| JP | 1999188965 | | 7/1999 |
| JP | 13-207088 A | | 7/2001 |
| JP | 2001207088 | | 7/2001 |
| JP | 2004039379 | | 2/2004 |
| JP | 2004-39379 A | | 5/2004 |

OTHER PUBLICATIONS

CAS Reg. No. 532-31-0, Nov. 16, 1984.*
International Search Report for PCT/KR2005/004099, two pages, mailed Jun. 5, 2006.*
International Search Report for Related PCT Application No. PCT/KR2005/004099, 2PP.
"International Search Report" for PCT/KR2005/004099, Korean Intellectual Property Office, Jun. 5, 2006, 1 pages, Daejeon, Republic of Korea.
"International Preliminary Report on Patentability" for PCT/KR2005/004099, International Bureau of WIPO, Mar. 11, 2008, 4 pages, Geneva, Switzerland.
"Written Opinion of the International Searching Authority" for PCT/KR2005/004099, Korean Intellectual Property Office, Jun. 5, 2006, 3 pages, Daejeon, Republic of Korea.

* cited by examiner

*Primary Examiner* — Douglas Mc Ginty
(74) *Attorney, Agent, or Firm* — Elizabeth Kim

(57) ABSTRACT

The present invention relates to solution type silver organo-sol ink for forming electrically conductive patterns. The present invention provides silver organo-sol ink of solution type for forming electrically conductive pattern comprising effective amount of silver aromatic carboxylate and a reactive organic solvents, which can form chelate or complex with silver, are, for example, organic solvents having keton, mercapto, carboxyl, aniline or sulfurous functional group, substituted or unsubstituted. By the present invention, silver organo-sol ink of solution type basically having higher content of silver is obtained. The solution type ink of the present invention can be used for forming conductive patterns in flat panel display such as plasma display panel(PDP) to reduce the numbers of steps for pattern forming drastically.

7 Claims, 2 Drawing Sheets

[Figure 1]
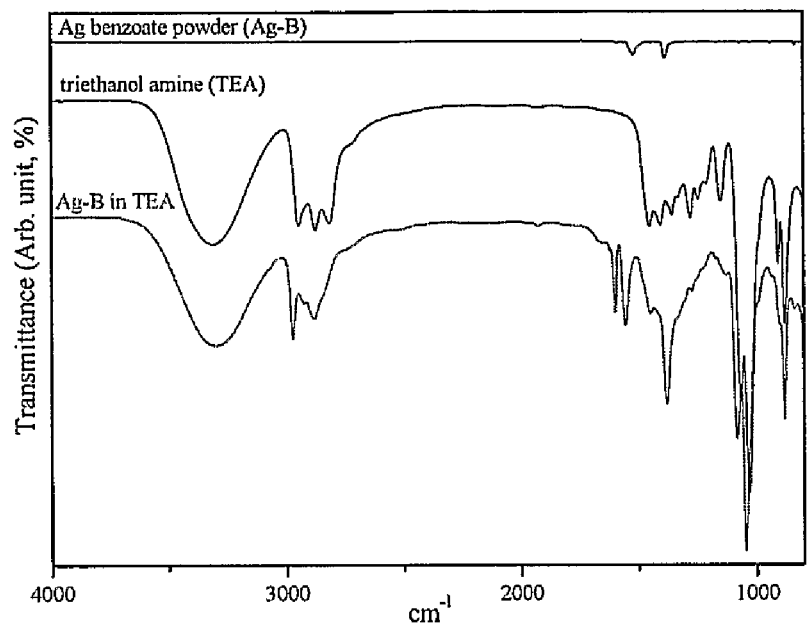
[Figure 2]

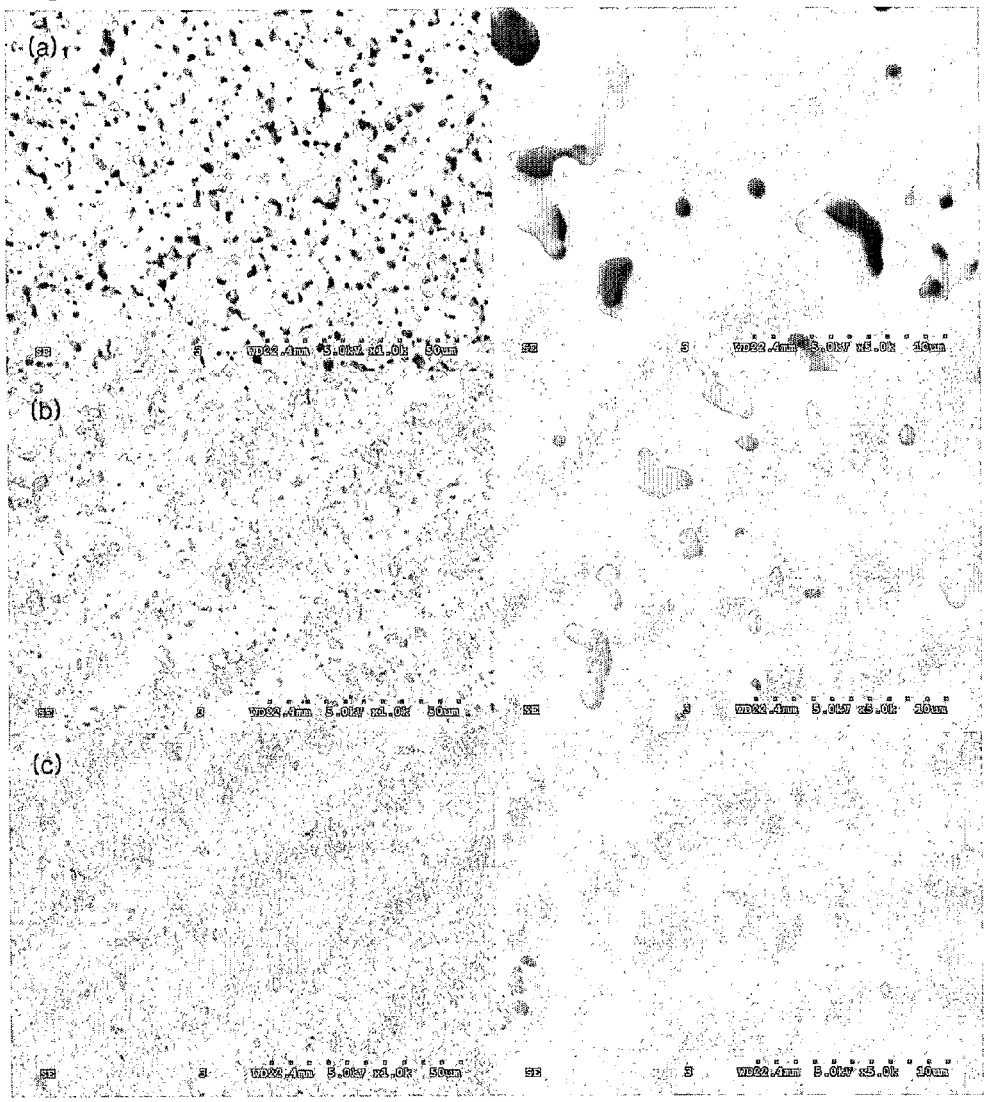
[Figure 3]

SILVER ORGANO-SOL INK FOR FORMING ELECTRONICALLY CONDUCTIVE PATTERNS

TECHNICAL FIELD

The present invention relates to silver organo-sol ink, more specifically solution type silver organo-sol ink for forming electrically conductive patterns.

BACKGROUND ART

Pattern forming technologies used in semiconductor and display industries are classified into 3 categories. One is a subtractive method mainly applied to thin film technologies such as CVD, PVD and sputtering wherein a metal layer is deposited on a substrate, a photo-resist layer is patterned by lithography on the metal layer, and then the metal layer is etched as a pattern. Another is an additive method used in thick film technologies such as screen-printing. The other is a subtractive-additive method adopting both of a subtractive method and an additive method. Pattern forming by an additive method is an economic process, which spares material and decreases number of steps, but additive methods of thick film technologies such as screen-printing are not so fine as thin film technologies, and thus are applied to different processes.

If an additive method accomplishes finer patterns, it is more favorable in aspects of environment and cost reduction. For example, attempts to apply an additive method to pattern forming for color filters originally formed by thin film technologies have been made. In this context, pattern forming by inkjet printing has been recently noted.

MOD material has been researched since Vest, R.W. tested inks made of MOD material (IEEE Transactions on Components, Hybrids and Manufacturing Technology, 12(4), 545-549, 1987). Kydd, et al in WO98-37133 disclosed inkjet-printing ink consisting of MOD material and particulate metal. U.S. Pat. No. 6,878,184 owned by Kovio Inc. disclosed metal ink of nano-size particle prepared from MOD and a reductant (for example, aldehydes). Many attempts have been made to use ink containing dispersed fine metal particles, especially silver particles for forming electrically conductive pattern. A new inkjet-printing system including nozzles should be devised with inks dispersed with fine metal particles, i.e., fine silver particles because those behave differently from ordinary inks. In addition, additives added to sustain suspension would do harm to the physical properties of patterns formed.

In the above-mentioned respect, inks containing MOD (metallo-organic de-composition material) can be applied to traditional inkjet printing devices without severe modification of the system if those are thoroughly solution. Solution inks containing MOD, in addition, can lower the temperature of metalization, and thus can be applied on flexible substrates such as plastic.

Korean Patent Publication No. 2004-85470 applied by Haeuncomtec disclosed a metal ink for inkjet-printing consisting of 5~40 t % of silver oxide, 10-20 wt % of lactam, lactone or carbonate and 20-85 wt % of amine. The ink prepared in the example is likely suspension rather than solution considering the dark color of the ink. Emulsifier which may do harm to the physical properties of patterns formed, should be added to the ink to sustain suspension, In addition, maintenance problems concerning nozzle clog caused by particles may arise.

Prior arts published to date are listed below as Table 1 and Table 2.

TABLE 1

| | | | | Patent Documents | |
| --- | --- | --- | --- | --- | --- |
| No. | Country | Applicant(Inventor) | Title of Invention | Application Date(Publication or Registration No.) | Technical Features |
| 1) | US | Engelhard(Pascaline Nguyen) | metallized substrates and process for producing | 1986, 9, 10(Pat. No. 4808274) | Metal carboxylate, alcoholate, mercaptide, amino + carboxylate, acyl + carboxylate, alkoxide |
| 2) | US | (Michael G. Firmstone, et al) | Seed layer compositions containing organogold and organosilver compounds | 1990, 4, 27(Pat. No. 5059242) | metal bonded to hydrocarbon through thio, polythio, carboxylate bridge |
| 3) | US | Degussa (Lotze; Marion) | Gold(I) mercapto-carboxylic acid esters, method of their preparation and use | 1993, 4, 5(Pat. No. 5312480) | gold(I)mercaptocarboxyic acid ester used for ceramic gold decoration |
| 4) | PCT | Parelec, Inc. (Kydd; Paul H. □□) | Material and method for printing high conductivity electrical conductors and other components on thin film transistor arrays | International Application 1997, 9, 12(international publication WO98-37133) | metal powder + MOD or ROM (reactive organic medium); MOD is defined as organic material bonded to metal through hetero atoms such as O, N, S, P, As and Se |

TABLE 1-continued

Patent Documents

| No. | Country | Applicant(Inventor) | Title of Invention | Application Date(Publication or Registration No.) | Technical Features |
|---|---|---|---|---|---|
| 5) | US | Kovio, Inc (Rockenberger; Joerg) | Nanoparticle synthesis and the formation of inks therefrom | 2002, 8, 9(Pat. No. 6878184) | particulate ink prepared by reducing MOD(or metal powder + RMO) with aldehydes |
| 6) | South Korea | haeuncomtec (Kwangchun-Jung) | Organic silver composition, preparing method therefor, inks prepared therefrom and method for forming conductive circuit with use thereof | 2003, 03, 28(Publication No. 2004-84570) | 5-40 wt % of Ag + 10-20 wt % of (lactam, lacton or carbonate + 20-85 wt % of amine |

TABLE 2

Nonpatent Documents

| No. | author | Title of Article | Publication date | Technical features |
|---|---|---|---|---|
| 1) | Teng, K. F., and Vest, R. W. | Liquid Ink Jet Printing with MOD Inks for Hybrid Microcircuits | IEEE Transactions on Components, Hybrids and Mamufacturing Technology, 12(4), 545-549, 1987 | MOD is mentioned as organic material bonded to metal through hetero atoms such as O, N, S and P Specifically, silver neodecanoate and Au amine 2-ethylhexoate is examplified. Dielectric ink and resistance ink are mentioned |
| 2) | Lea Yancey | Direct Write Metallizations with Organometallic Inks | 2000, 8, 18 undergraduate thesis of Berkely University | (hfa)Ag(COD), (hfa)Cu(BTMS) and(hfa)Cu(VTMS) are spayed or printed by inkjet printing on heated glass annealed and resistance are tested |
| 3) | C. Curtis, | Metallizations by Direct-Write Inkjet Printing | To be presented at the NCPV Program Review Meeting Lakewood, Colorado14-17 October 2001 | (hfa)Ag(COD) |
| 4) | Alex Martins on | Synthesis of Single Phase SrCu2O2 from Liquid Precursors | Peer-Reviewed science Journal 2004, 3, 3 | SrCu2O2 from MOD(copper formate and strontium acetate) is printed and annealed at 770° C. used as photosemi-conductor of solar cell |
| 5) | Kevin Cheng,* | Ink-Jet Printing, Self-Assembled Polyelectrolytes, and Electroless Plating: | Macromol. Rapid Commun. 2005, 26, 247-264 | laminating polymer electrolytes PAA and PAH by PEM technology and patterning the laminar with catalyst Na2PdCl4 and deposit in copper bath electolessly. lower metalization is possible |

DISCLOSURE OF INVENTION

Technical Problem

The object of the present invention is to provide silver organo-sol ink for forming electrically conductive patterns with good physical properties.

The other object of the present invention is to provide silver organo-sol ink, which can be applied to traditional printing methods including inkjet-printing.

Technical Solution

The present invention provides silver organo-sol ink of solution type for forming electrically conductive pattern comprising effective amount of silver aromatic carboxylate defined as Formulas 1; and solvent dissolving said silver aromatic carboxylate

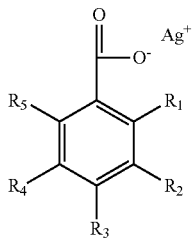

Formulas 1 in which $R_1$, $R_2$, $R_3$, $R_4$ and $R_5$ are respectively $COO^-Ag^+$, H, OH or C1 to C9 alkyl. Herein, "organo-sol" means that silver exist as solution state bound to organic material.

The said dissolving solvent desirably consists of a reactive organic solvent, which can form chelate or complex with silver, and polar or nonpolar diluent solvent for control of viscosity. The reactive organic solvents, which can form chelate or complex with silver, are, for example, organic solvents having keton, mercapto, carboxyl, aniline or sulfurous functional group, substituted or unsubstituted. The silver aromatic carboxylate is typically 5~70 wt % of the total ink composition.

As a preferred embodiment, the present invention provides silver organo-sol ink of solution type comprising 10 to 50 wt % of silver aromatic carboxylate defined as Formulas 1a; 10 to 60 wt % of reactive organic solvent selected from the group consisting of amine substituted by one or more C1 to C6 hydroxy alkyl and C2 to C16 aliphatic thiol, linear or branched; and residual polar or nonpolar diluent solvent

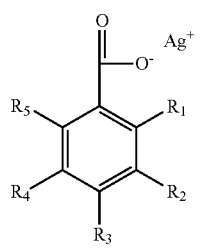

Formulas 1a in which $R_1$, $R_2$, $R_3$, $R_4$ and $R_5$ are respectively H, OH or C1 to C9 alkyl. Said silver aromatic carboxylate defined as Formulas 1a is most desirably silver benzoate when $R_1$, $R_2$, $R_3$, $R_4$ and $R_5$ are respectively H.

As another preferred embodiment, the present invention provides silver organo-sol ink of solution type comprising 10 to 50 wt % of silver aromatic carboxylate defined as Formulas 1b; 10 to 60 wt % of reactive organic solvent selected from the group consisting of amine substituted by one or more C1 to C6 hydroxy alkyl and C2 to C16 aliphatic thiol, linear or branched; and residual polar or nonpolar diluent solvent

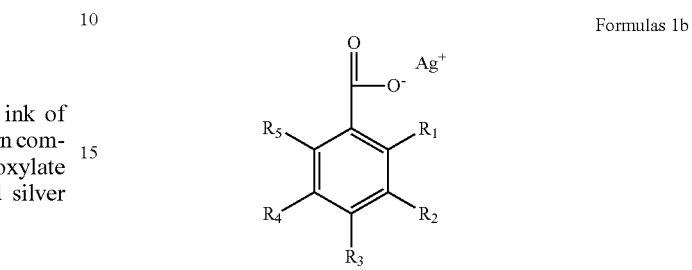

Formulas 1b in which one among $R_1$, $R_2$, $R_3$, $R_4$ and $R_5$ is $COO^-Ag^+$ the others are respectively H, OH or C1 to C9 alkyl, but desirably $R_3$ is $COO^-Ag^+$. Said silver aromatic carboxylate defined as Formulas 1b is most desirably silver phthalate when $R_3$ is $COO^-Ag^+$ and the others $R_1$, $R_2$, $R_3$, $R_4$ and $R_5$ are respectively H.

As another preferred embodiment, the present invention provides silver organo-sol ink of solution type comprising 10 to 50 wt % of silver aromatic carboxylate defined as Formulas 1c; 10 to 60 wt % of reactive organic solvent selected from the group consisting of amine substituted by one or more C1 to C6 hydroxy alkyl and C2 to C16 aliphatic thiol, linear or branched; and residual polar or nonpolar diluent solvent

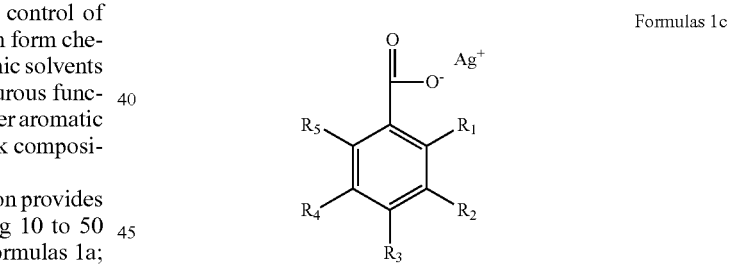

Formulas 1c in which two or more among $R_1$, $R_2$, $R_3$, $R_4$ and $R_5$ are $COO^-Ag^+$, the others are respectively H, OH or C1 to C9 alkyl, but desirably $R_2$ and $R_4$ are $COO^-Ag^+$. Said silver aromatic carboxylate defined as Formulas 1c is most desirably silver trimesate when $R_2$ and $R_4$ are $COO^-Ag^+$ and the others $R_1$, $R_3$ and $R_5$ are respectively H.

The organo-sol ink of the present invention may further comprise surfactants and/or viscosity controlling agents. In addition, it may comprise further nonconductive polymeric or glassy material as matrix or flux material for silver conductor. The organo-sol ink of the present invention can be applied not only to processes for display manufacturing such as PDP and Rfid but also to other processes such as solar cells wherein conductive patterns are required.

Silver aromatic carboxylate defined as Formulas 1 has higher contents of silver, especially, silver benzoate has about 47 wt % of silver per mole of the compound. It has a merit of higher content of metalized silver even if small quantity is adopted.

Silver aromatic carboxylate defined as Formulas 1 in the organo-sol ink of the present invention desirably ranges from 5 wt % to 70 wt % of the total ink composition since silver content becomes small below 5 w % and making solution with it becomes difficult above 70 wt %. The preferred range is 10 wt % to 50 wt %. The most preferred range is 20 wt % to 40 wt %. Silver aromatic carboxylate defined as Formulas 1 is prepared by reacting silver inorganic acid salt such as silver nitrate with alkali metal salt corresponding to Formulas 1 with silver replaced by alkali metal.

The said reactive organic solvent is broadly organic solvent which can form chelate or complex with silver through hetero atom N, O and S, more preferably, hydrocarbons having keton, mercapto, carboxyl, aniline or sulfurous functional group, substituted or unsubstituted. The most preferred are monoethanolamine, diethanolamine and triethanolamine. The organo-sol ink of the present invention has light color but is basically clear. The viscosity of the initial solution which is prepared by dissolving the silver organic salt in a reactive organic solvent such as ethanolamine ranges about 10,000 to 100,000 cp, and thus it can be used in screen-printing, offset-printing and imprinting. It also can be diluted by diluent such as ethanol or water according to the object of use.

Silver organo-sol prepared by dissolving silver aromatic carboxylate in reactive solvent, for example, amine substituted by one or more ethanol may be further diluted with ethylene glycol or water to be deposited on a hydrophilic substrate. On the other hand, it may be diluted with an alcohol of short chain alcohol such as ethanol to be deposited on a substrate having a hydrophobic metal oxide film thereon. It is presumed that the solubility increases drastically because the reactive organic solvent forms complex with the silver aromatic carboxylate by chelating or coordinate covalent bonding.

A preferred nonpolar diluent solvent is an aliphatic or aromatic hydrocarbon or mixture thereof. A preferred polar diluent solvent is water or C1 to C12, saturated or unsaturated, mono to tri functional aliphatic alcohol. The organic solvent, for example, is 2-methoxy ethanol, 1,2-hexanediol, benzene, toluene, xylene, dimethylcarbithol, kerosene ethanol, methanol, 2-propanol, chloroform or ethylene glycol.

The solution type ink of the present invention can be used for forming conductive patterns in flat panel display such as plasma display panel(PDP) to reduce the numbers of steps for pattern forming drastically. Especially, since metalized silver from the silver organo-sol ink of the present invention is stable at relatively higher temperature, for example, 450~600° C., more specifically, at 480~580° C., the silver ink is appropriate for conductive pattern forming in PDP manufacturing wherein sealing and sintering of barrier ribs is carried out around the temperature range.

Advantageous Effects

By the present invention, silver organo-sol ink of solution type basically having higher content of silver is obtained. The solution type ink of the present invention can be used for forming conductive patterns in flat panel display such as plasma display panel(PDP) to reduce the numbers of steps for pattern forming drastically.

BRIEF DESCRIPTION OF THE DRAWINGS

FIG. 1 shows IR spectrometer graphs of silver powder, triethanolamine and silver organo-sol ink used by Example 1.

FIG. 2 is a photograph showing contact angle against glass of silver organo-sol ink prepared by Example 1.

FIG. 3 shows from above respectively (a) SEM images of two scales regarding a sample after heat-treatment at 550° C. for 10 minutes prepared by Example 3, (b) SEM images of two scales regarding a sample prepared by Example 4 after heat-treatment at 550° C. for 10 minutes and (c) SEM images of two scales regarding a sample prepared by Example 5 after heat-treatment at 550° C. for 10 minutes.

BEST MODE FOR CARRYING OUT THE INVENTION

The present invention is illustrated by examples below. However, such examples presented for the purpose of illustration does not serve as a basis to decide the scope of the invention.

Example 1

50 mmol benzoic acid is dissolved in 50 mL of methanol. 50 mmol NaOH dissolved in 50 mL water is added slowly to the benzoic acid solution prepared while stirring to obtain sodium benzoate. 50 mmol silver nitrate dissolved in 50 mL water is added to the sodium benzoate solution, and then white precipitate forms fast. The precipitate is washed to remove unreacted silver nitrate and NaOH with water, filtered and washed several times to remove unreacted benzoic acid with methanol. The filtrant white silver benzoate is sensitive to light and should be dried and stored in dark room or under yellow light.

0.07 mol prepared powder of silver benzoic acid (molecular weight: about 228 g/mol) is dissolved in 0.14 mol triethanolamine and 40 mL ethylene is added to control viscosity. The viscosity of the solution prepared is 15 cPs at 25° C. by Brookfield viscometer. Absorption bands around 1000 and 1300 $cm^{-1}$ characteristic peak of silver solution are also observed by IR spectrometer.

The contact angle of the solution against glass substrate is observed to be about 40° C. The glass is coated by the ink solution prepared with a bar coater, heat-treated at 150° C. for 10 minutes and resistance is measured to be $5.5 \times 10^{-6} \Omega \square\square$. The coated glass is further heat treated at 500° C. The resistance is $2.505 \times 10^{-6} \Omega \square\square$. The solid content of the solution ink is about 63 wt % of the total solution since the weights of the solution coated and residual solid after heat-treatment at 500° C. are respectively 0.5804 g and 0.3656 g.

Example 2

50 mmol benzoic acid is dissolved in 50 mL of methanol. 50 mmol NaOH dissolved in 50 mL water is added slowly to the benzoic acid solution prepared while stirring to obtain sodium benzoate. 50 mmol silver nitrate dissolved in 50 mL water is added to the sodium benzoate solution, and then white precipitate forms fast. The precipitate is silver benzoate formed by exchange of Na+ and Ag+ by ionization tendency, washed to remove unreacted silver nitrate and NaOH with water, filtered and further washed several times to remove unreacted benzoic acid with methanol, and dried at 50° C. to obtain final silver benzoate.

0.07 mol prepared powder of silver benzoic acid (molecular weight: about 228 g/mol) is dissolved in 0.14 mol OT (octanethiol). Xylene is added so that the viscosity of the solution prepared should be between 13~15 cps at 25° C. by Brookfield viscometer, and the solution is agitated for 30 minute more.

Glass substrate is coated by the ink solution prepared with a bar coater, heat-treated 150° C. for 10 minutes and resistance is measured. The coated glass is further heat-treated at 500° C. The resistance is measured. By the residual solid content of the solution ink after heat-treatment at 500° C. the final silver content is decided. Volumetric resistance with thickness of coated film is measured. The resistance is 2.75× $10^{-6} \Omega \square \square$. The solid content of the solution ink is about 54.3 wt % of the total solution. Amounts of reagents and measured value are listed in Table 3.

Example 3

50 mmol benzoic acid is dissolved in 50 mL methanol. 50 mmol NaOH dissolved in 50 mL water is added slowly to the benzoic acid solution prepared while stirring to obtain sodium benzoate. 50 mmol silver nitrate dissolved in 50 mL water is added to the sodium benzoate solution, and then white precipitate forms fast. The precipitate is silver benzoate formed by exchange of Na+ and Ag+ by ionization tendency, washed to remove unreacted silver nitrate and NaOH with water, filtered and further washed several times to remove unreacted benzoic acid with methanol, and dried at 50° C. to obtain final silver benzoate.

0.21 mol prepared powder of silver benzoic acid (molecular weight: about 228 g/mol) is dissolved in 0.42 mol TEA (triethanol amine). Ethanol is added so that the viscosity of the solution prepared should be 15 cps at 25° C. by Brookfield viscometer, and the solution is agitated for 30 minute more.

Glass substrate is coated by the ink solution prepared with a bar coater, heat-treated 150° C. for 10 minutes and resistance is measured. The coated glass is further heat treated at 550° C. The resistance is measured. The microstructure is shown in FIG. 3 According FIG. 3, silver particles are fused together after heat-treatment at 550° C. even on 10,000 times enlarged images. By the residual solid content of the solution ink after heat-treatment at 550° C. the final silver content is decided. Volumetric resistance with thickness of coated film is measured. Amounts of reagents and measured value are listed in Table 3.

Example 4

Example 4 is carried out the same way as Example 2 except that terephthalic acid is used instead of benzoic acid. The microstructure is shown in FIG. 3. According FIG. 3, silver particles are fused together after heat-treatment at 550° C. even on 10,000 times enlarged images. Volumetric resistance with thickness of coated film is measured. Amounts of reagents and measured value are listed in Table 3.

Example 5

Example 5 is carried out the same way as Example 2 except that trimesic acid is used instead of benzoic acid. The microstructure is shown in FIG. 3. According FIG. 3, silver particles are fused together after heat-treatment at 550° C. even on 10,000 times enlarged images. Volumetric resistance with thickness of coated film is measured. Amounts of reagents and measured value are listed in Table 3.

TABLE 3

| Example | Precursor | Amount (mol) | Reactive solvent name | Amount (mol) | Solvent Name | Amount (ml) or (g) | resistance ($10^{-6} \Omega \cdot \square$) |
|---|---|---|---|---|---|---|---|
| 1. Ag 1 | | 0.07 | TEA | 0.14 | xylene | 40 (ml) | 2.505 |
| 2. Ag 1 | | 0.07 | OT | 0.14 | EtOH | 40 (ml) | 2.75 |
| 3. Ag 1 | | 0.21 | EA | 0.42 | EtOH | 58 (g) | 9.9 |
| 4. Ag 2 | | 0.21 | EA | 0.84 | EtOH | 186 (g) | 2.7 |
| 5. Ag 3 | | 0.21 | EA | 1.26 | EtOH | 150 (g) | 1.1 |

*Ag 1; One COOAg Ag 2; Two COOAg Ag 3; Three COOAg

INDUSTRIAL APPLICABILITY

The solution type ink of the present invention can be used for forming conductive patterns by traditional printing technology, especially by inkjet-printing, in flat panel display such as plasma display panel(PDP) to reduce the numbers of steps for pattern forming drastically.

The invention claimed is:

1. Silver organo-sol ink of full solution type for forming electrically conductive patterns, consisting essentially of:
    10 to 50 wt % of silver aromatic carboxylate selected from the group consisting of silver benzoate, silver phthalate and silver trimesate;
    10 to 60 wt % of reactive organic solvent dissolving the silver aromatic carboxylate so that silver in the silver organo-sol ink exists as solution state bound to organic material; and
    residual diluting solvent;
    wherein the reactive organic solvent is selected from the group consisting of ethanol amine, diethanol amine and triethanolamine amine; and
    wherein metallized silver from the silver organo-sol ink is stable at a temperature range of about 450° C. to about 600° C.

2. Silver organo-sol ink of full solution type according to claim 1, wherein said silver aromatic carboxylate is silver phthalate.

3. Silver organo-sol ink of full solution type according to claim 1, wherein said silver aromatic carboxylate is silver trimesate.

4. Silver organo-sol ink of full solution type according to claim 1, wherein silver content in the silver organo-sol ink is at least about 63 weight percent of the total solution, after heat treatments at about 150° C. and about 500° C.

5. A method of forming conductive patterns on a flat panel display, comprising:
    preparing a solution type silver organo-sol ink by dissolving silver aromatic carboxylate in reactive solvent so that silver in the silver organo-sol ink exists as solution state bound to organic material, wherein metallized silver from the silver organo-sol ink is stable at a temperature range of about 450° C. to about 600° C.;
    coating a glass substrate of the flat panel display with the silver organo-sol ink;
    heat treating the coated glass substrate; and
    using the silver organo-sol ink to form conductive patterns in the flat panel display.

6. The method of claim 5, wherein the flat panel display is a PDP (plasma display panel).

7. The method of claim 5, wherein the silver organo-sol ink consists essentially of: 10 to 50 wt % of silver aromatic carboxylate selected from the group consisting of silver benzoate, silver phthalate and silver trimesate; 10 to 60 wt % of reactive organic solvent dissolving the silver aromatic carboxylate, the reactive organic solvent selected from the group consisting of ethanol amine, diethanol amine and triethanolamine amine; and residual diluting solvent.

* * * * *